United States Patent [19]

Dubujet

[11] Patent Number: 4,900,950
[45] Date of Patent: Feb. 13, 1990

[54] POWER ON RESET CIRCUIT FOR A MOS TECHNOLOGY INTEGRATED CIRCUIT

[75] Inventor: Bruno Dubujet, Palette, France

[73] Assignee: SGS Thomson Microelectronics S.A., Gentilly, France

[21] Appl. No.: 200,959

[22] Filed: Jun. 1, 1988

[30] Foreign Application Priority Data

Jun. 12, 1987 [FR] France ................. 87 08190

[51] Int. Cl.$^4$ ............ H03K 17/22; H03K 17/20; H03K 5/153; H03K 17/687
[52] U.S. Cl. ......................... 307/272.3; 307/594; 307/362
[58] Field of Search ............ 307/296 R, 297, 296 A, 307/296.5, 296.4, 272.3, 200 B, 592, 594, 603, 362, 304

[56] References Cited

U.S. PATENT DOCUMENTS

| | | | |
|---|---|---|---|
| 4,365,174 | 3/1982 | Kucharewski | 307/594 |
| 4,419,596 | 11/1983 | Kikuchi | 307/603 |
| 4,581,552 | 4/1986 | Womack et al. | 307/594 |
| 4,705,966 | 11/1987 | Van Zanten | 307/297 X |
| 4,716,322 | 12/1987 | D'Arrigo et al. | 307/362 X |
| 4,728,820 | 3/1988 | Lee | 307/594 X |

FOREIGN PATENT DOCUMENTS

| | | | |
|---|---|---|---|
| 56-116323 | 9/1981 | Japan | 307/594 |
| 59-57316 | 4/1984 | Japan | 307/594 |

Primary Examiner—Stanley D. Miller
Assistant Examiner—David R. Bertelson
Attorney, Agent, or Firm—Roland Plottel

[57] ABSTRACT

A powering circuit to start up a MOS technology integrated circuit consists of first means made up of an oscillator and a voltage-increasing device to generate, from a supply voltage, a voltage greater than said supply voltage, and second means to measure the difference between the supply voltage and the generated voltage and to generate a powering signal when the difference reaches a given threshold.

20 Claims, 3 Drawing Sheets

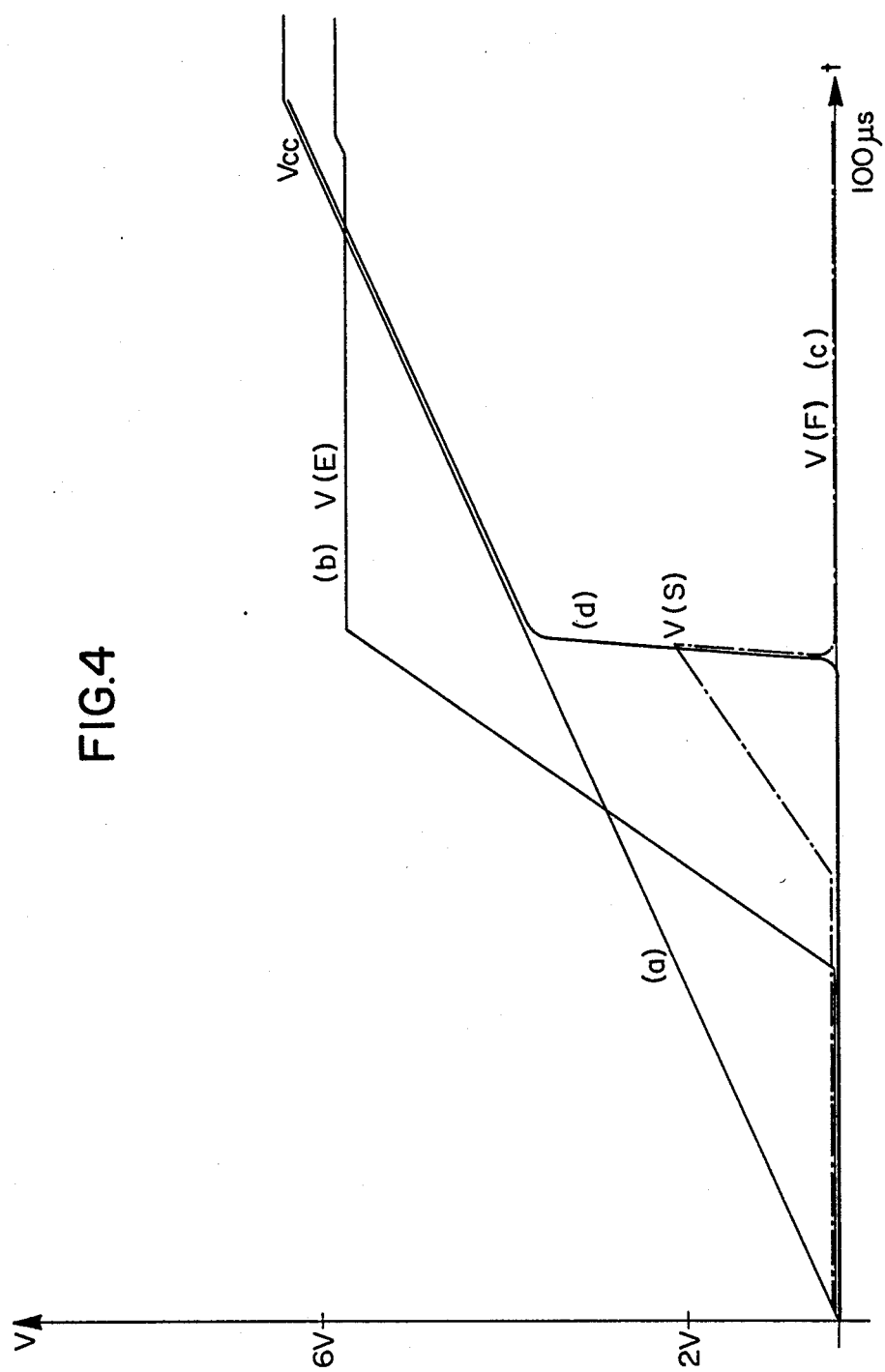

POWER ON RESET CIRCUIT FOR A MOS TECHNOLOGY INTEGRATED CIRCUIT

BACKGROUND OF THE INVENTION

1. Field of the Invention

The present invention relates to a powering circuit for a MOS (metal oxide semiconductor) technology integrated circuit, especially a C-MOS (complementary MOS) technology integrated circuit.

2. Description of the Prior Art

In certain types of integrated circuits, especially those containing flip-flops, it is important for some points of the circuit to have a well-defined logic states when the circuit is powered after an interruption in the power supply. For it is necessary to prevent uncertain or wrong logic states from appearing during the application of the supply voltage and from subsequently being reflected in the operation of the circuit.

The states of the nodes of the logic circuit cannot really have a definite value unless the supply voltage of the circuit exceeds a minimum value. For example, for a C-MOS technology logic circuit, this minimum value is 3 volts. For a smaller voltage, the nodes have variable potentials which depend more on the capacitive couplings of the circuit than on purely logical data. Furthermore, these potentials will differ from one circuit to another for batch-produced circuits.

Therefore, a powering circuit is used to remove this drawback. This circuit delivers a positioning pulse when the supply voltage has reached a value sufficient to enable the positioning of the logic circuit through a no-load operating cycle. Powering circuits currently available are generally complicated because there is no stabilized supply voltage. They are most commonly made by using the threshold voltages of MOS transistors, capacitor charges and numerous loops with positive and negative feedbacks.

An object of the present invention is to propose a new powering circuit which is particularly simple and efficient as compared with prior art powering circuits.

SUMMARY OF THE INVENTION

A powering circuit to energize a MOS technology integrated circuit which comprises first generating means using a supply voltage to generate a voltage greater than said supply voltage and second means to measure the difference between the supply voltage and the generated voltage and to generate a powering signal when the difference reaches a given threshold.

The present invention is based on the fact that the complexity of prior art powering circuits is due to the absence of supply. Consequently, the problem is solved by creating a specific supply through means that generate a voltage greater than the non-stabilized supply voltage.

According to a preferred embodiment, the first means comprises an oscillator connected to voltage-increasing device that delivers an output voltage which is greater than the supply voltage. Preferably, the oscillator consists of an odd number of series-connected inverters, the output terminal of the last inverter being looped back to the input terminal of the first inverter and the voltage-increasing device comprises a first direct-biased diode connected between the supply terminal and a first node of the circuit, a first capacitor connected between said first node and the first output terminal of an inverter, a second direct-biased diode connected between said first node of circuit (or circuit node) and a second node of the circuit, and a second capacitor connected between said second circuit node and the output terminal of a second inverter which is series-connected with said first inverter, the output of the voltage-increasing device being taken at said second circuit node.

To adjust the threshold of the output voltage, the voltage-increasing device may comprise one or more additional stages. Each stage consists, for example, of a diode connected between a penultimate circuit node and a last circuit node forming the output terminal of said voltage-increasing device and a capacitor connected between the last node and the output terminal of an additional inverter which is series-connected with the other inverters. The last stage consists of a direct-biased diode connected between the last node of the circuit and a following node forming the output terminal of said voltage-increasing device and a capacitor connected between the following node and a low voltage or ground. This enables the final filtering of the generated voltage.

Furthermore, the second means comprises a comparator circuit which respectively receives, at each input terminal, the generated voltage and the supply voltage, and which delivers, at its output terminal, a signal which is a function of the difference between said two voltages. Said second means further comprises a detection and shaping circuit connected to the output of the comparator circuit and generating the powering signal. The comparator circuit consists of two N-type MOS transistors which are series-connected between a current generator and the low voltage or ground. Similarly, the detection and shaping circuit consists of two inverter gates.

According to another feature of the present invention, to prevent the d.c. powering circuit from consuming current when the powering is done, it further has means to stop the operation of the circuit once the powering signal has been generated.

According to a preferred embodiment, said means to stop the operation of the circuit once the powering signal is generated, consist of NOR gates connected, respectively, in the loop of the oscillator and in the detection and shaping circuit, said NOR gates receiving the powering signal at one of their input terminals. The means to stop the operation of the circuit also stops the current generator.

According to yet another feature of the present invention, when the powering circuit is made with C-MOS technology, the diodes used in the voltage-increasing device consist each of a P-type MOS transistor, the three electrodes of which are connected together and form the cathode and the well N of which forms the anode.

BRIEF DESCRIPTION OF THE DRAWINGS

Other features and advantages of the present invention will appear from the following description of a preferred embodiment, made with reference to the appended drawings, of which.

DESCRIPTION OF A PREFERRED EMBODIMENT

Figure 1:
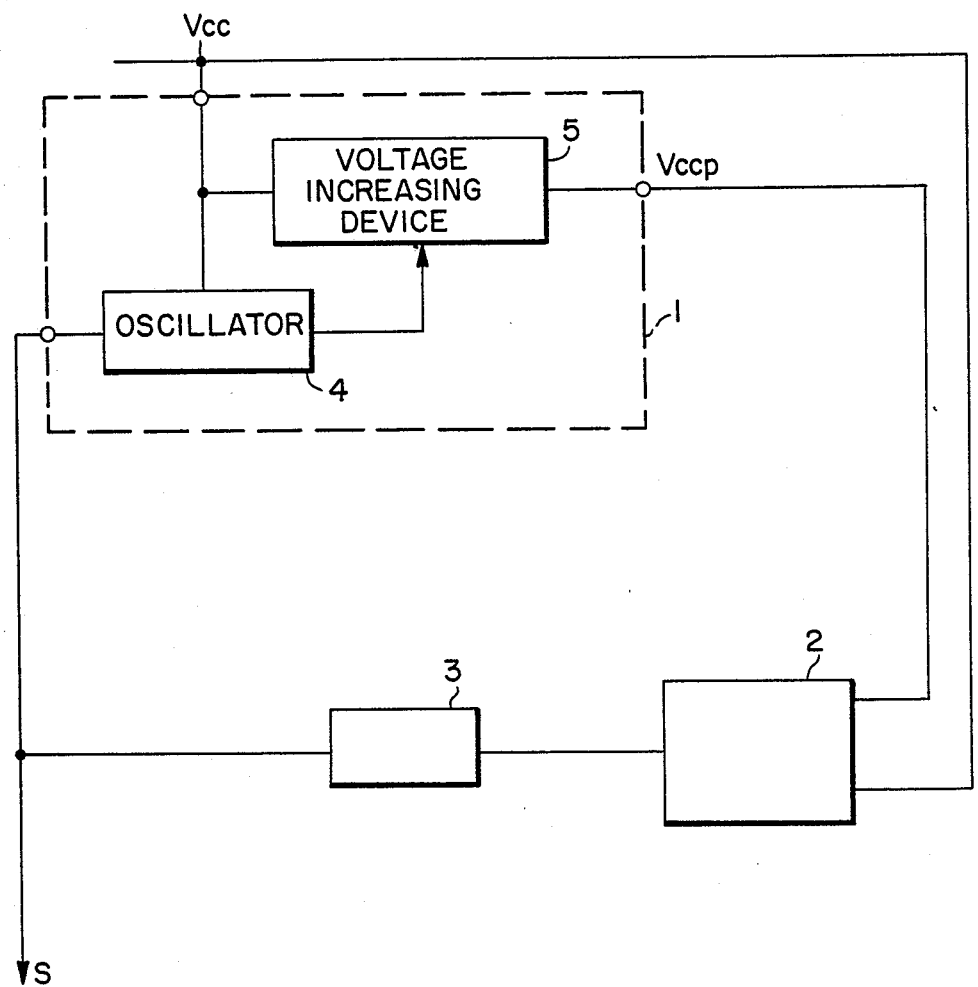
FIG. 1 is a schematic diagram of a powering circuit according to the present invention.

As shown in FIG. 1, the powering circuit according to the present invention essentially comprises first means 1 to generate, from the supply voltage $V_{cc}$ external to the integrated circuit, a voltage $V_{ccp}$ which is greater than said supply voltage, second means 2 to measure the difference between the external voltage $V_{cc}$ and the generated voltage $V_{ccp}$ and to generate powering signals, and means 3 to stop the operation of the circuit once the powering signal S has been generated.

First means 1 consists mainly of an oscillator 4. In the embodiment shown, the frequency of this oscillator depends on the supply voltage $V_{cc}$. This oscillator is connected to a voltage-increasing device 5 which also receives the supply voltage $V_{cc}$ and gives said voltage $V_{ccp}$ at the output terminal. Furthermore, the oscillator receives the output signal of means 3 so as to stop its operation when the powering signal S has just been generated.

Figure 2:
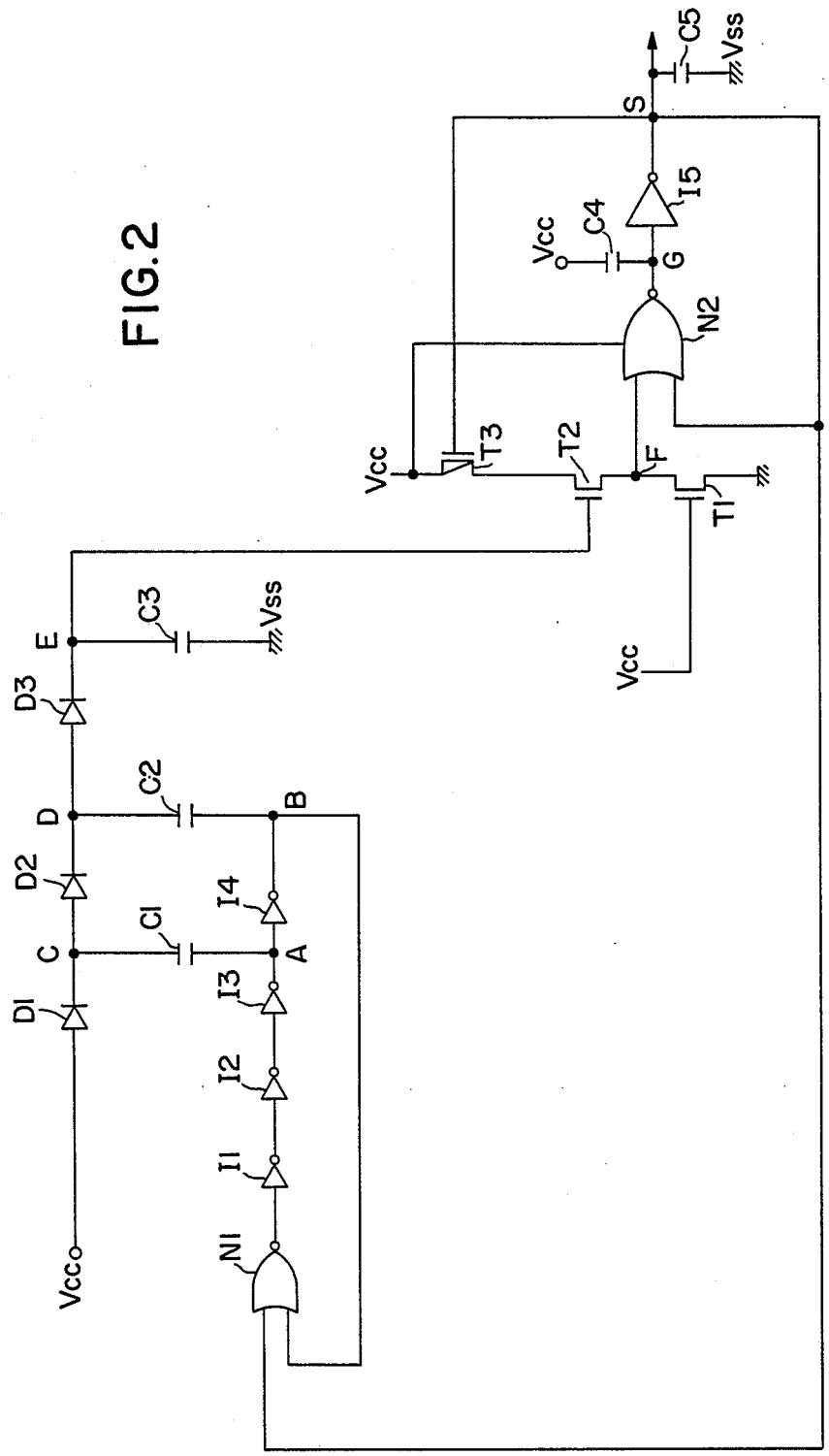
FIG. 2 is a diagram of an embodiment of the circuit of FIG. 1.

The circuit of FIG. 1 ca be made as shown in FIG. 2. Thus the oscillator 4 consists of an odd number of inverters, namely the four inverters $I_1$, $I_2$, $I_3$, $I_4$ and the NOR gate $N_1$ in the embodiment shown, the output terminal of the inverter $I_4$ being looped back to one of the input terminals of the NOR gate $N_1$. The oscillation frequency of the oscillator is therefore a function of the number of inverters and their propagation time. It will also depend on the supply voltage $V_{cc}$.

Furthermore, the voltage-increasing device 5 consists mainly of a first diode $D_1$, which is direct-bias connected between the source of external supply voltage $V_{cc}$ and a first circuit node C, a first capacitor $C_1$ which is connected between the first circuit node C and a node A at the output terminal of the inverter $I_3$, a second diode $D_2$ which is direct-bias connected between the first circuit node C and a second circuit node D, and a second capacitor $C_2$ which is connected between the first circuit node D and a node B at the output terminal of a second inverter $I_4$, the latter being series-connected with the first inverter $I_3$.

Furthermore, in the embodiment shown, the voltage-increasing device comprises a filtering stage consisting of a third diode $D_3$ which is direct-bias connected between the second circuit node D and a third circuit node E forming the output terminal of the "voltage-increasing device. It also comprises a capacitor $C_3$, which is connected between the third circuit node E and a low voltage or ground $V_{ss}$. This circuit can be used to obtain, at the circuit node E, a generated voltage $V_{ccp}$ which is greater than the supply voltage $V_{cc}$ as this shall be explained in greater detail below. Depending on the desired output voltage, the voltage-increasing device may contain additional stages. Each additional stage then consists of a diode which is direct-bias connected between the second circuit node and a third circuit node, and a capacitor which is connected between the third circuit node and the output terminal of an inverter. The filtering stage is then connected to the third circuit node.

According to the present invention, the circuit node E is connected to one of the input terminals of a comparator circuit which receives the external supply voltage $V_{cc}$ at its other input terminal.

As shown in FIG. 2, this comparator circuit consists of two N-type MOS transistors $T_1$ and $T_2$, which are series-connected between the low voltage or ground $V_{ss}$ and a current generator. In the embodiment shown, the current generator consists of a P-type MOS transistor $T_3$ which has one of its electrodes connected to resistive divider formed by the two transistors $T_1$ and $T_2$, its other electrode connected to the source of the external power voltage $V_{cc}$ and its gate connected, in the embodiment shown, to the output terminal S. The common node F between the two transistors $T_1$ and $T_2$ is connected to one of the input terminals of a NOR gate $N_2$, which receives the output signal S from the circuit at its other input terminal. The output terminal of the NOR gate $N_2$ is connected to an inverter $I_5$ which delivers the powering signal S at its output terminal. In fact, the NOR gate $N_2$ and the inverter $I_5$ constitute a detection and shaping circuit which delivers the powering signal S when the signal at the node F reaches a given threshold.

Furthermore, in the embodiment shown, the powering signal or output signal S is applied to the input terminal of the NOR gate $N_1$. The application of the powering signal S on the oscillator 4, on the detection and shaping circuit, consisting of the gates $N_2$ and $I_5$, and on the current generator $T_3$ makes it possible to stop the operation of the powering circuit once the powering signal has been generated. This stoppage is important because it prevents the powering circuit from consuming current when it is no longer needed since the external power voltage has reached its operating threshold. In a powering circuit having no means to stop the operation of the circuit, the NOR gates $N_1$ and $N_2$ can be replaced by inverters and the gate of the transistor $T_3$ can be connected to the low voltage or ground.

Additionally, to obtain accurate positioning of certain nodes of the circuit when the power is turned on, stabilizing capacitors are provided. Thus, a capacitor $C_4$ is connected between the source of the external supply voltage $V_{cc}$ and a common point G between the gate $N_2$ and the inverter $I_5$, and a capacitor $C_5$ is connected between the output terminal of the inverter 5 and the low voltage or ground $V_{ss}$.

An explanation shall be given below of the operation of the circuit shown in FIG. 2, with the help of the curves of FIG. 4.

First, the operation of both the oscillator 4 and the voltage-increasing device 5 shall be explained. In order to operate, the value of the external supply voltage $V_{cc}$ should reach at least the threshold voltage of the inverters that constitute the oscillator. From this moment onwards, when the node A is at the logic level "0", the capacitor $C_1$ is charged at a voltage corresponding to $V_{cc} - V_{td}$, $V_{td}$ being the threshold voltage of the diodes. In this case, the point B is at a high level equal to $V_{cc}$ and the point D is at a voltage substantially equal to $V_{cc} - 2V_{td}$. When the node A changes to the logic state "1", namely to the voltage $V_{cc}$, the node C changes to a voltage equal to $2V_{cc} - V_{td}$, for the capacitor $C_1$ has not yet had the time to be discharged. The diode $D_1$ is then turned off. The node B returns to the logic level "0" and the node D is also at the logic level "0" for $C_2$ is not charged. It then goes to the voltage $2V_{cc} - 2V_{td}$ and the node E, which was substantially at 0 volt, goes to the voltage $2V_{cc} - 3V_{td}$. At the same time, the two capacitors $C_2$ and $C_3$ are charged, thus making it possible to keep the voltage at the point E substantially equal at $2V_{cc} - 3V_{td}$. However, the above-described circuit can work when $V_{cc}$ is greater than $3V_{td}$, namely with a threshold voltage above 1.5 volts if the diodes have a 0.5 Volt threshold. As a result of substrate effects, the circuit operates properly from a voltage $V_{cc}$ substantially equal to 2.5 volts and above In addition, the oscillating frequency of the oscillator is such that, once the different capacitors $C_1$, $C_2$, $C_3$ are charged, they hardly undergo any discharge when the voltages at points A and B are being switched between the high and low levels and, hence, a generated voltage $V_{ccp}$ is obtained at the node E. This voltage $V_{ccp}$ is greater than $V_{cc}$ and is substantially independent of the oscillation frequency. With the above-described circuit, for a voltage $V_{cc}$, increasing linearly up to $\approx 7$ volts as shown by the curve (a), the voltage represented by the curve (b) is obtained at the point E, and the circuit starts operating for a voltage $V_{cc} \approx 2.5$ volts.

The voltage $V_{ccp}$ is applied to the gate of the transistor $T_2$ while the gate of the transistor $T_1$ receives the external supply voltage $V_{cc}$. With the resistive divider formed by the transistors $T_1$, $T_2$, and the current generator $T_3$ generating a current as a function of the power supply $V_{cc}$, so long as the voltage $V_{ccp}$ is smaller than the threshold voltage of the transistor $T_2$, the voltage at the node F remains at 0 as shown by the curve (c) in FIG. 4. Then, with $$V_{T2} < V_{ccp} < V_{cc},$$

the voltage at the point F remains low for the transistor $T_2$ is more resistive than the transistor $T_1$. Then, when the voltage $V_{ccp}$ becomes greater than $V_{cc}$, the voltage at the node F increases, while the transistor $T_2$ becomes less and less resistive. When the voltage at the node F reaches the threshold voltage of the NOR gate $N_2$, the latter flips. In the embodiment of the present invention, the threshold voltage of the NOR gate is obtained by means of the transistors that constitute it. The change of state of the NOR gate $N_2$ to a logic level "0" causes the inverter $I_5$ to flip to the logic level "1", which applies the powering signal S to the integrated circuit. This powering signal is also applied to the NOR gate $N_2$, which flips back immediately to the logic level "1", to the NOR gate $N_1$ so as to block the oscillator, and to the current generator $T_3$ so as to stop it. To obtain accurate positioning when the power is turned on, the node G is initially positioned at logic level "1" by means of the capacitor $C_4$ connected to the power voltage $V_{cc}$, while the node S is positioned at logic level "0" through the capacitor $C_5$, connected to the low voltage $V_{ss}$. Consequently, the voltage applied to the integrated circuit has the shape shown by the curve (d).

Figure 3:
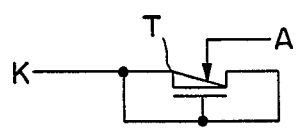
FIG. 3 is a diagram of a diode used in the circuit of FIG. 2, and, FIG. 4 shows the curves V(t) at different points of the circuit.

As shown in FIG. 3, the diodes used in the voltage-increasing device 5 consist of a P-type MOS transistor T, all three electrodes of which are connected together and form the cathode K and the well P of which forms the anode A of the diode. In this case, the existing diode is used directly between the well P and the diffusion nT. This embodiment has many advantages. In particular, the threshold voltage is stable. It is 0.5 volt to 0.6 volt, depending on the manufacturing process.

What is claimed is:

1. A power on reset circuit for starting a MOS technology integrated circuit, comprising voltage-increasing means supplied by a supply voltage, for building a voltage higher than said supply voltage, and comparing means for comparing said higher voltage and said supply voltage and for delivering a powering signal when the difference between said voltages exceeds a given threshold.

2. A circuit according to claim 1 further comprising an oscillator connected to said voltage-increasing means.

3. A circuit according to claim 1 wherein said second means consist of a comparator circuit receiving said generated voltage and said supply voltage, respectively, at each input terminal, and delivering an output signal which is a function of the difference between said two voltages, said second means further consisting of a detection and shaping circuit connected to the output terminal of said comparator circuit and generating the powering signal.

4. A circuit according to claim 3 wherein the comparator circuit consists of two N-type MOS transistors, which are series-connected between a current generator and a low voltage or ground.

5. A circuit according to claim 3 wherein the detection and shaping circuit consists of a first inverter gate with a defined threshold voltage, and of an inverter the input terminal of which is connected to the output terminal of said first inverter gate.

6. A circuit according to claim 3 wherein said means to stop the operation of the circuit, once the powering signal has been generated, consist of NOR gates connected, respectively, in the loop of said oscillator and in the detection and shaping circuit, said NOR gates receiving the powering signal at one of their input terminals, said stopping means further consisting of a current generator.

7. A circuit according to claim 4 wherein said current generator consists of a P-type MOS transistor having one of its electrodes connected to the supply voltage source and its gate connected to the powering signal.

8. A circuit according to claim 1 further comprising means to stop the operation of the circuit once the powering signal has been generated.

9. A circuit according to claim 2 wherein the oscillator consists of an odd number of series-connected inverters, the output of the last inverter being looped back to the input terminal of the first inverter.

10. A circuit according to claim 2 wherein the voltage-increasing device comprises a first diode which is direct-bias connected between the supply terminal and a first circuit node, a first capacitor which is connected between said first circuit node and the output terminal of a first inverter, a second diode which is direct-bias connected between said first circuit node and a second circuit node, and a second capacitor which is connected between said second circuit node and the output terminal of a second inverter which is series-connected with said first inverter, the output terminal of the voltage-increasing device being said second circuit node.

11. A circuit according to claim 9 wherein the voltage-increasing device comprises a first diode which is direct-bias connected between the supply terminal and a first circuit node, a first capacitor which is connected between said first circuit node and the output terminal of a first inverter, a second diode which is direct-bias connected between said first circuit node and a second circuit node, and a second capacitor which is connected between said second circuit node and the output terminal of a second inverter which is series-connected with said first inverter, the output terminal of the voltage-increasing device being said second circuit node.

12. A circuit according to claim 11 wherein the voltage-increasing device further comprises at least one additional stage.

13. A circuit according to claim 12 wherein the additional stage consists of a diode which is direct-bias connected between a penultimate circuit node and a second circuit node forming the output terminal of said voltage-increasing device, and a capacitor, which is connected between the last node and the output terminal of an additional inverter, which is series-connected with the other inverters.

14. A circuit according to claim 11 wherein the voltage-increasing device further comprises a filtering stage consisting of a diode, which is direct-bias connected between said last node forming the output of the voltage-increasing device and a new output terminal node, and a capacitor which is connected between said new output circuit node and a low voltage or ground.

15. A circuit according to claim 11 wherein, in C-MOS technology, the diodes are made with a P-type MOS transistor, all three electrodes of which are connected together and form the cathode, and the wall N of which forms the anode.

16. A circuit according to claim 13 wherein, in C-MOS technology, the diodes are made with a P-type MOS transistor, all three electrodes of which are connected together and form the cathode, and the well N of which forms the anode.

17. A circuit according to claim 10 wherein the voltage-increasing device further comprises at least one additional stage.

18. A circuit according to claim 17 wherein the additional stage consists of a diode which is direct-bias connected between a penultimate circuit node and a second circuit node forming the output terminal of said voltage-increasing device, and a capacitor, which is connected between the last node and the output terminal of an additional inverter, which is series-connected with the other inverters.

19. A circuit according to claim 10 wherein the voltage-increasing device further comprises a filtering stage consisting of a diode, which is direct-bias connected between said last node forming the output of the voltage-increasing device and a new output terminal node, and a capacitor which is connected between said new output circuit node and a low voltage or ground.

20. A circuit according to claim 10 wherein, in C-MOS technology, the diodes are made with a P-type MOS transistor, all three electrodes of which are connected together and form the cathode, and the well N of which forms the anode.

* * * * *